(12) United States Patent
Kunst et al.

(10) Patent No.: US 7,423,247 B2
(45) Date of Patent: Sep. 9, 2008

(54) AUTOMATIC CONTROL OF LASER DIODE CURRENT AND OPTICAL POWER OUTPUT

(75) Inventors: David Kunst, Cupertino, CA (US); Steven Martinez, Tucson, AZ (US); Robert James Lewandowski, Shoreline, WA (US); Peter Chambers, Phoenix, AZ (US); Joseph James Judkins, Austin, TX (US); Luis Torres, Rolling Meadows, IL (US); Thomas A. Lindsay, Brier, WA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 11/626,302

(22) Filed: Jan. 23, 2007

(65) Prior Publication Data
US 2007/0114361 A1   May 24, 2007

Related U.S. Application Data

(63) Continuation of application No. 10/294,469, filed on Nov. 13, 2002, now Pat. No. 7,166,826.

(51) Int. Cl.
*G01J 1/32* (2006.01)
*H01S 3/00* (2006.01)
*H01S 3/13* (2006.01)

(52) U.S. Cl. ............ 250/205; 372/29.011; 372/29.014; 372/29.015; 372/29.021; 372/33; 372/34; 372/38.01; 372/38.02; 372/38.07

(58) Field of Classification Search ............ 372/29.021, 372/29.014, 29.015, 29.011, 33, 38.02, 38.08, 372/34, 38.01, 38.07; 250/205
See application file for complete search history.

(56) References Cited

U.S. PATENT DOCUMENTS

| | | | |
|---|---|---|---|
| 5,097,473 A | 3/1992 | Taguchi | |
| 6,862,302 B2 * | 3/2005 | Chieng et al. | 372/29.02 |
| 6,898,223 B2 | 5/2005 | Seo | |
| 6,947,455 B2 * | 9/2005 | Chieng et al. | 372/29.021 |
| 6,947,456 B2 * | 9/2005 | Chin et al. | 372/38.02 |
| 6,954,476 B2 * | 10/2005 | Coldren et al. | 372/38.02 |
| 6,967,320 B2 * | 11/2005 | Chieng et al. | 250/238 |
| 2002/0114363 A1 * | 8/2002 | Everett | 372/33 |
| 2005/0111501 A1 * | 5/2005 | Chieng et al. | 372/29.02 |

\* cited by examiner

*Primary Examiner*—Davienne Monbleau
(74) *Attorney, Agent, or Firm*—Dorsey & Whitney LLP

(57) ABSTRACT

An automatic power control system provides a control signal that regulates the output power of at least one laser diode. Coarse adjustment of the control signal is provided by a first means, preferably a digital variable resistor, while fine adjustment and compensation is provided by a second means, preferably by a digital-to-analog converter that receives an input signal proportional to a sensed control system parameter. The control system includes an operational amplifier having a first input coupled to sense output power, and a second input coupled to a DAC to provide finer resolution control. Memory can store system parameter or system parameter variations that can be coupled to the DAC and/or variable resistor to enhance system stability over ambient variations.

12 Claims, 6 Drawing Sheets

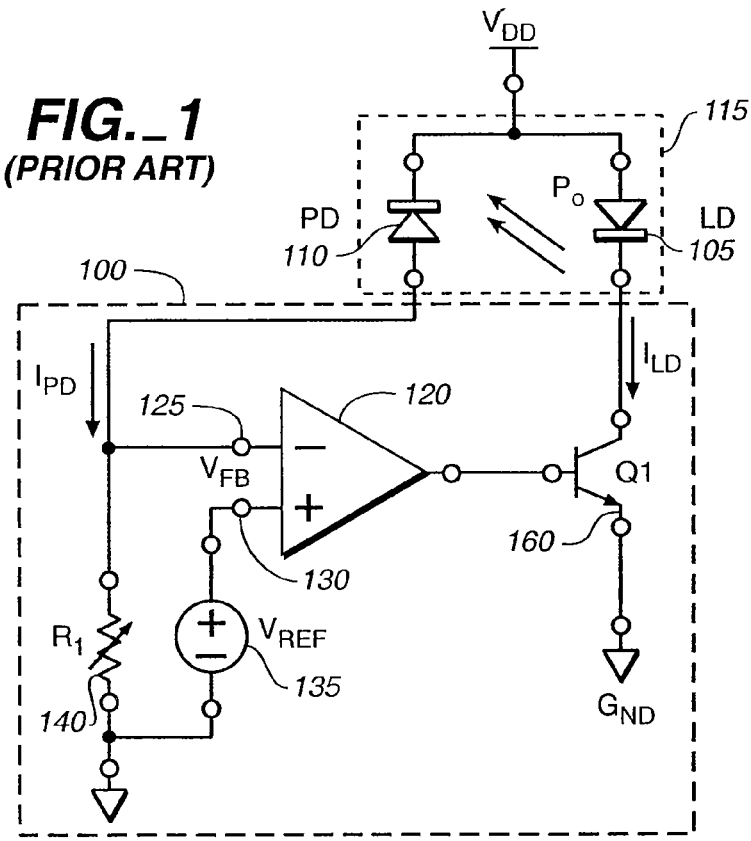
FIG._1
(PRIOR ART)
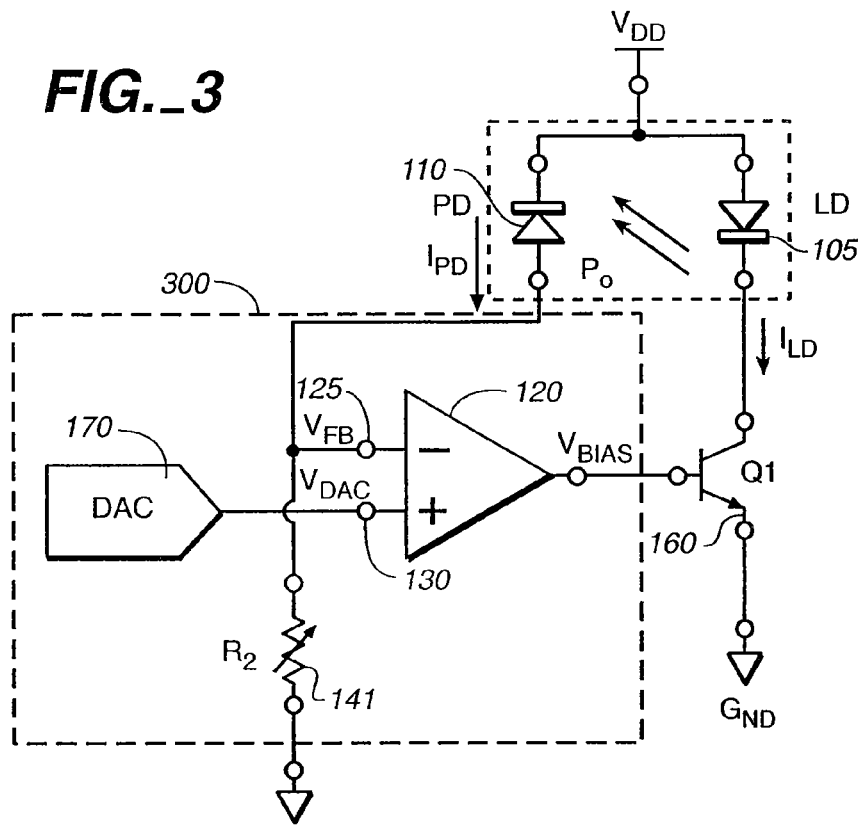
FIG._3

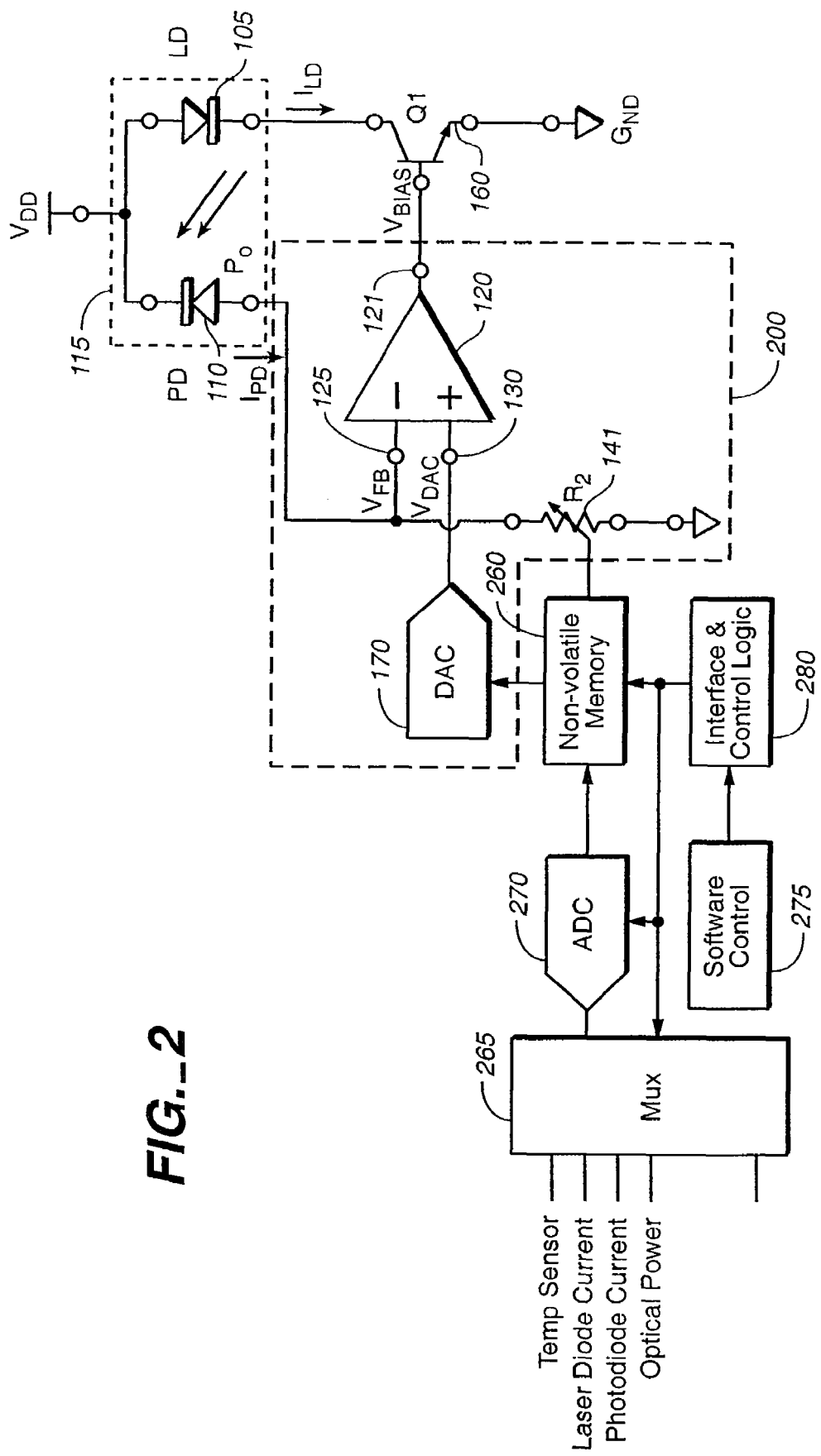
FIG._2

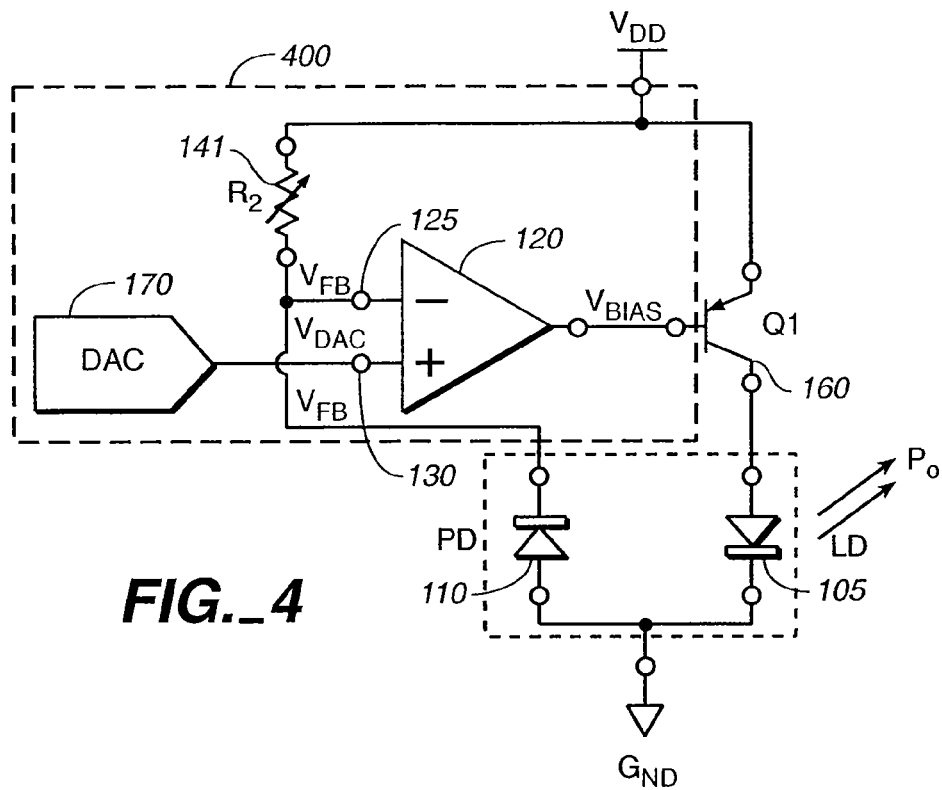
FIG._4
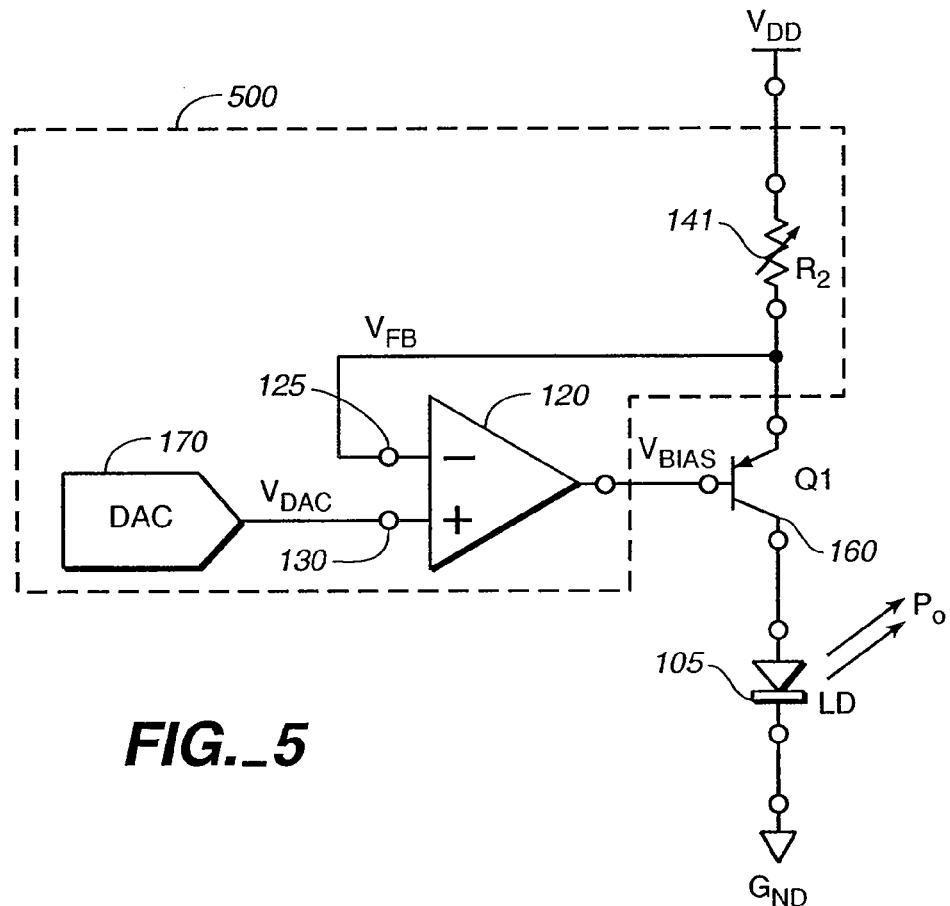
FIG._5

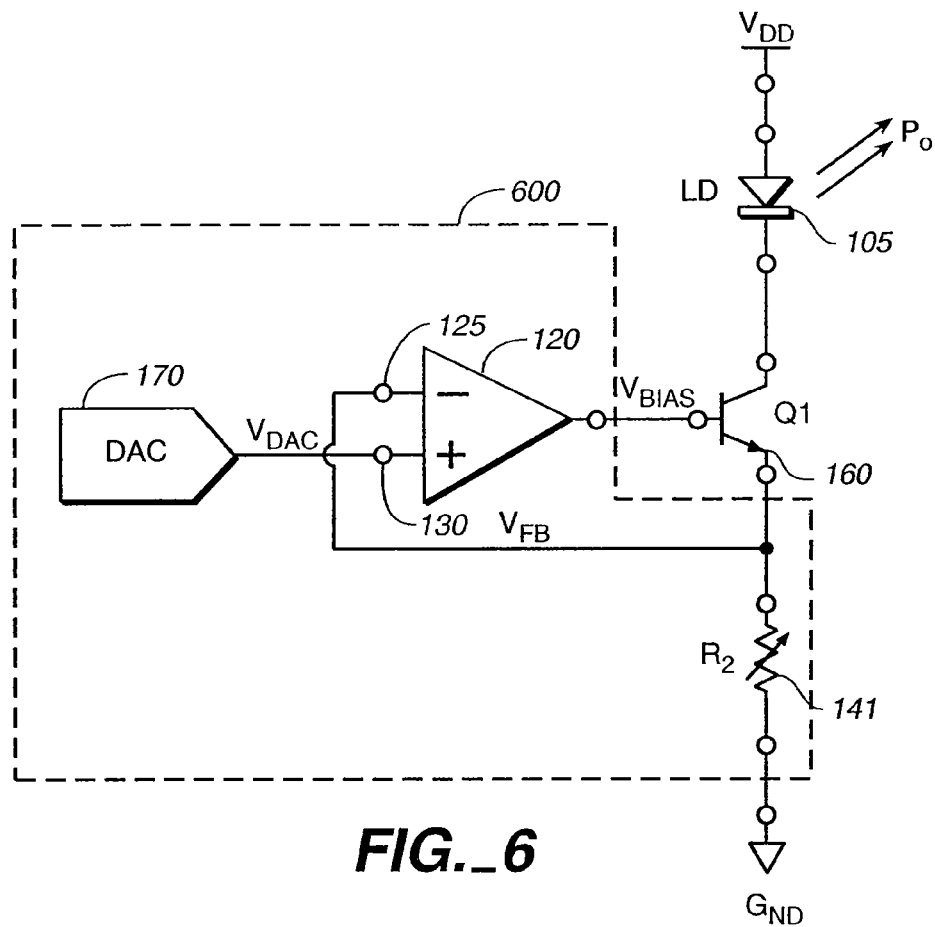
FIG._6
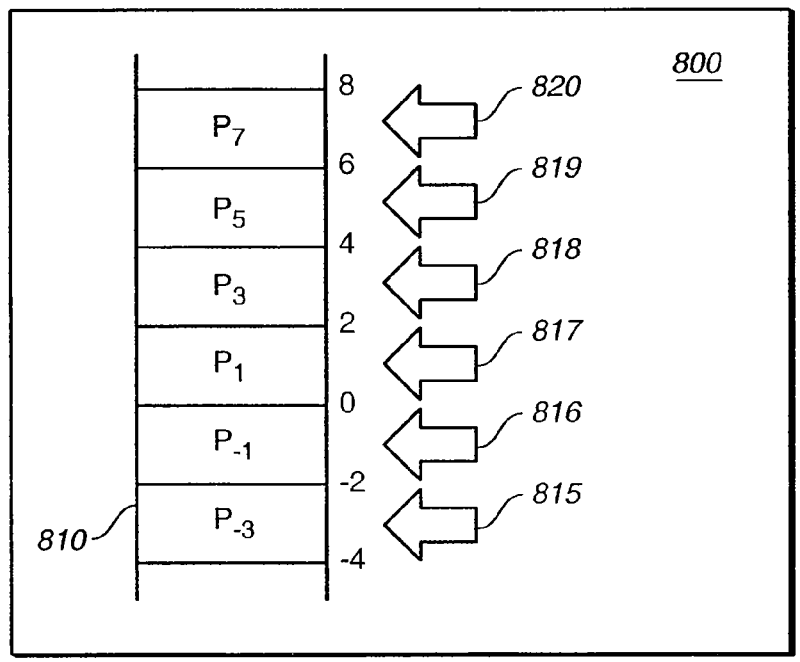
FIG._10

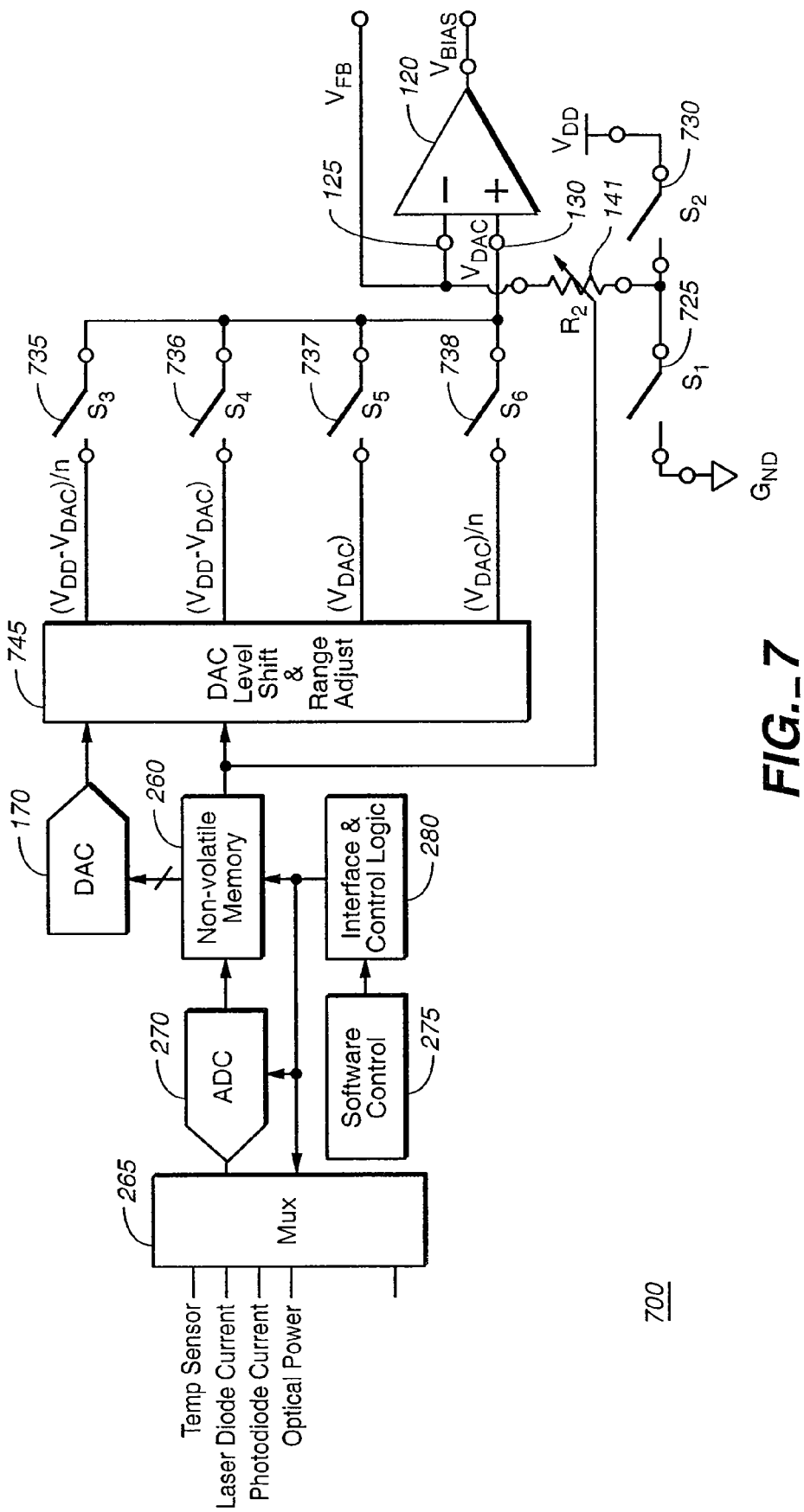
FIG._7

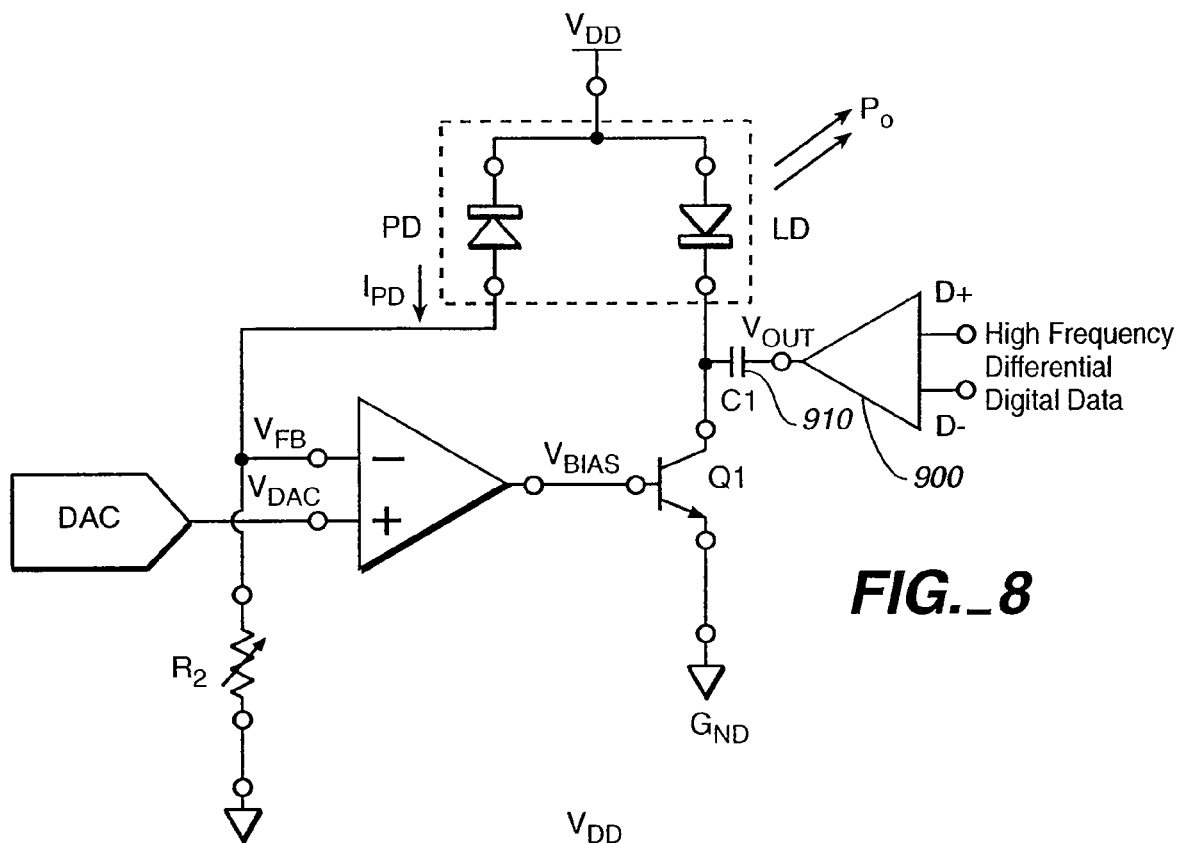
FIG._8
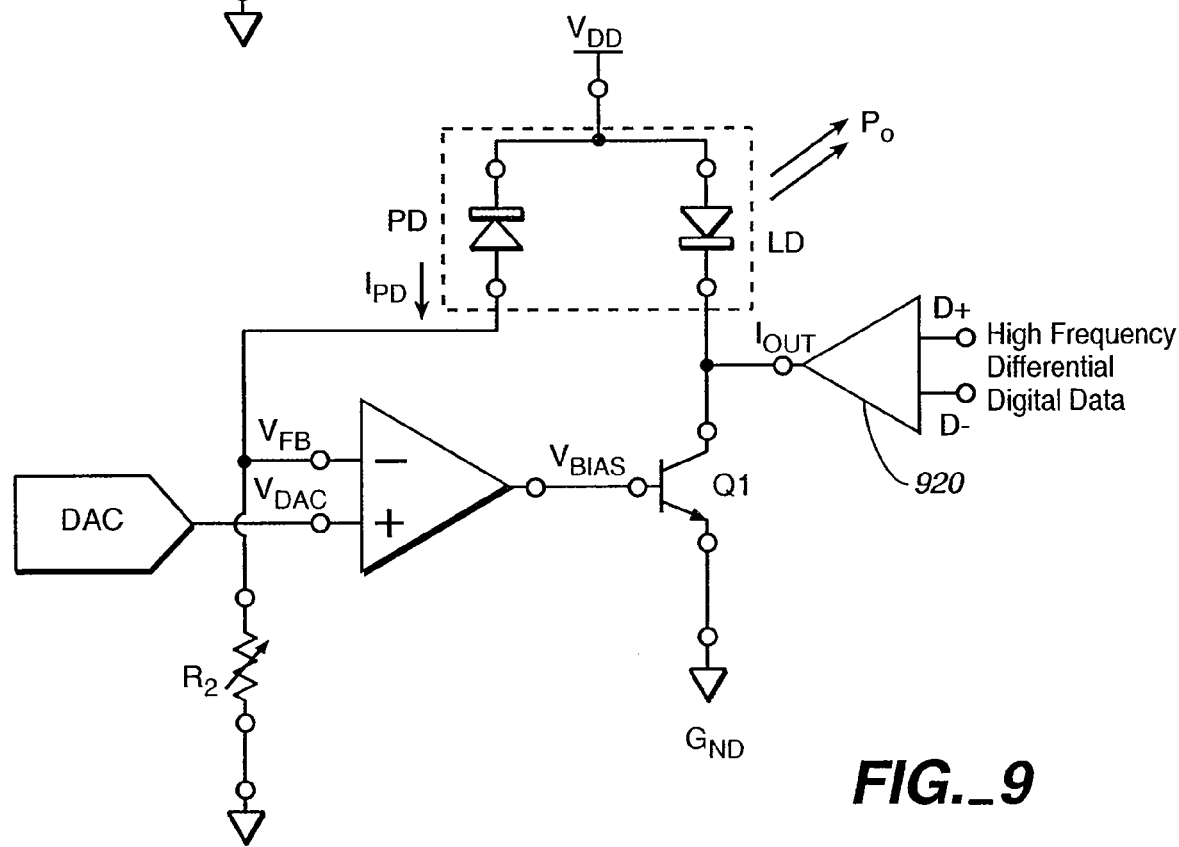
FIG._9

AUTOMATIC CONTROL OF LASER DIODE CURRENT AND OPTICAL POWER OUTPUT

CROSS REFERENCE TO RELATED APPLICATION

This application is a continuation of U.S. patent application Ser. No. 10/294,469, filed Nov. 13, 2002, and entitled AUTOMATIC CONTROL OF LASER DIODE CURRENT AND OPTICAL POWER OUTPUT, the contents of which are hereby incorporated herein in their entirety.

FIELD OF THE INVENTION

The present invention relates generally to laser diodes and associated control systems, temperature compensation for such systems, and more particularly to control of laser diode current and optical power output in fiber optic communication systems.

BACKGROUND

Laser diodes, also known as an injection lasers or diode lasers, are commonly used in optical fiber systems, communication systems, compact disc players, laser printers, remote-control devices, intrusion systems, and the like to provide coherent radiation in response to applied current.

It is desirable to control the power output of a laser diode with an automatic power control (APC) circuit to enhance reliability and stability. Conventional automatic power control circuit 100 used to control the optical power output ($P_O$) of common-anode laser diode 105 is shown in FIG. 1. The function of control system 100 is to increase the current flowing through laser diode 105, $I_{LD}$, in response to a decrease in $P_O$, and to decrease the current flowing through laser diode 105 in response to an increase in $P_O$, such that a constant $P_O$ is maintained. Briefly, in FIG. 1, a servo-control loop is formed by drive device 160 (here an NPN transistor), laser diode (LD) 105, monitor photodiode (PD) 110, laser diode optical power output set resistor ($R_1$) 140, and control operational amplifier 120. Laser diode 105 and monitor photodiode 110 may be packaged together as a so-called transmitter optical sub-assembly (TOSA), 115. The optical power output ($P_O$) of laser diode 105 is proportional to the laser diode current ($I_{LD}$) supplied by NPN drive transistor 160. Photodiode 110 monitors the optical power output of laser diode 105 and produces a proportional output current ($I_{PD}$). The monitor photodiode current provides negative feedback to control op amp 120. The result is that the voltage at node 125, the inverting input of op amp 120, is stabilized to $V_{REF}$, the voltage at the positive or non-inverting input of op amp 120 provided in control loop 100 by voltage source 135. In the configuration shown, monitor photodiode current is set by $I_{PD}=V_{REF}/R_1$. Operational amplifier 120 drives the base of transistor 160 to satisfy the servo loop by increasing or decreasing the laser diode current until the voltage across $R_1$ 140 is substantially equal to $V_{REF}$.

If the value of resistor 140 decreases, then the photodiode current, and hence laser diode optical power output, will increase to satisfy the servo loop. Likewise, if the value of resistor 140 increases, then the photodiode current and laser diode optical power will decrease. Accordingly, in the embodiment shown in FIG. 1, resistor 140 is used to set and adjust the desired optical power output of the laser diode.

The magnitude of resistor 140 and the voltage at node 130 play a role in determining the stability and usability of control system 100. That is, resistor 140 must be adjustable over a wide enough resistance range to accommodate the full range of anticipated values for $I_{PD}$ and $I_{LD}$, preferably with a high degree of resolution, while keeping control system 100 stable and operative. However, $I_{PD}$ and $I_{LD}$ can vary significantly across diode types and applications. Further, resistor 140 must have sufficient thermal, or other parameter, stability to adjust $I_{LD}$ during operation to maintain temperature, or other operating parameter, stability.

Consequently, resistor 140 must have a large adjustment range and good thermal stability and typically is realized with a mechanical potentiometer or a digital potentiometer. A temperature-controlled non-volatile digital potentiometer can theoretically provide both initial calibration and temperature compensation. However, providing resistor 140 with these operating characteristics may be prohibitively expensive.

Further, large variations in laser diode and photodiode characteristics, such as output optical energy, wavelength and the like, as well as variations in optical power output requirements according to application or status, result in tradeoffs between the achievable $P_O$ adjustment range and resolution for a given resistor 140. Typical laser diode parameters and variations can be found, for example, in "Modulating VCSELs: Honeywell Application Sheet" (Honeywell Inc.; Freeport, Ill.) http://content.honeywell.com/vcsel/technical/006703_1.pdf, hereby incorporated by reference, and in HFE419x-521 datasheet "Fiber Optic LAN Components—LC Connectorized High-Speed VCSEL 2.5 Gbps" www.honeywell.com/sensing/VCSEL hereby incorporated by reference. Accordingly, to achieve sufficient dynamic range for calibration, and adequate resolution for temperature compensation, prior art automatic power control systems for laser diodes typically employ one of the following solutions: (1) a one-size-fits-all approach for resistor 140, degrading system performance due to the range versus resolution limitations of potentiometers, or (2) replacing a resistor 140 with several resistors or with dynamically switchable resistors, or adding a second potentiometer, which increases manufacturing complexity and cost.

Further, when providing temperature compensation, devices typically use a discrete time sampling technique. Jitter in the amount of compensation applied may when the temperature, or other discrete-time measured parameter, is close to the threshold between two adjacent digital results, and the measured value varies stochastically between those two results. Since the amount of compensation applied depends on the temperature, or other measured parameter, the compensation is subject to the same jitter. Further, quantization noise may cause the digital result to vary between two adjacent results when the measured parameter is in between two adjacent results. Quantization noise is generally equal to ±½ least significant bit (LSB).

In general, there is a need for an automatic power control system that is relatively insensitive to laser diode and photodiode parameter variations, while providing control operation over a wide range of optical power output requirements. Such a system should provide laser diode current control, including control for a variety of laser diode configurations. There is a further need for a compensation system and method that is relatively free from jitter due to electronic and/or quantization noise.

The present invention provides such a control and compensation system.

SUMMARY OF THE INVENTION

A first aspect of the invention provides a control system that generates a control signal to control output power. The control system includes a sensor that senses the magnitude of the output power, an operational amplifier (op amp) to compare the sensed output power against a reference signal and adjust the control signal appropriately to maintain a magnitude of the output power. The control system further includes means for coarsely adjusting the magnitude of the control signal, means for sensing at least one parameter, such as temperature, associated with the control system, and means for less coarsely adjusting the magnitude of the control signal based on the sensed parameter.

Another aspect of the invention provides a method for generating a control signal to control output power. The magnitude of the output power is sensed and compared against a reference signal. The control signal is adjusted by coarsely adjusting the control signal based on the desired output power, sensing at least one parameter associated with the control system, such as temperature, and less coarsely adjusting the magnitude of the control signal based on the sensed parameter.

A further aspect of the invention provides a method of compensating a system variable in response to a system parameter. A look-up table having a plurality of system parameter offset ranges and a compensation constant associated with each of said ranges is provided. A system parameter is sampled, and a compensation point associated with the system parameter is calculated. A compensation constant is looked-up that is associated with the compensation point, and the compensation constant is used to adjust the system variable.

BRIEF DESCRIPTION OF THE DRAWINGS

FIG. 1 schematically depicts an embodiment of a laser diode output power control system according to the prior art.

FIG. 2 schematically depicts an embodiment of a laser diode optical power output control system for a common-anode, optical feedback configuration, according to an embodiment of the present invention.

FIG. 3 schematically depicts an embodiment of a laser diode optical power output control system for a common-anode, optical feedback configuration, according to an embodiment of the present invention.

FIG. 4 schematically depicts an embodiment of a laser diode optical power output control system for a common-cathode, optical feedback configuration, according to an embodiment of the present invention.

FIG. 5 schematically depicts an embodiment of a laser diode optical power output control system for a common-cathode, current feedback configuration, according to an embodiment of the present invention.

FIG. 6 schematically depicts an embodiment of a laser diode optical power output control system for a common-anode, current feedback configuration, according to an embodiment of the present invention.

FIG. 7 schematically depicts programmable switch control and digital-to-analog converter (DAC) level shifting and ranging circuitry to realize topologies shown in FIGS. 2-6, according to an embodiment of the present invention.

FIG. 8 schematically depicts AC-coupling of digital data to a laser diode, according to an embodiment of the present invention.

FIG. 9 schematically depicts DC-coupling of digital data to a laser diode, according to an embodiment of the present invention.

FIG. 10 schematically depicts an embodiment of a compensation procedure according to an embodiment of the present invention.

DESCRIPTION OF THE INVENTION

The present invention provides automatic power control systems to regulate the output power of one or a plurality of laser diodes. In general, a coarse setting of laser diode optical power is provided by a variable resistor, while fine adjustment and compensation is simultaneously provided through the use of a digital-to-analog converter (DAC). Various embodiments of the present invention support common-cathode, common-anode, optical feedback, and current feedback configurations, as well as combinations thereof. Further, each configuration may support non-volatile memory storing configuration, calibration, or temperature compensation information, or the like, for use by the variable resistor and/or DAC.

In another aspect, systems, methods, and circuit topologies are provided to reduce or substantially remove threshold-sensitive jitter from compensation applied to a system based on a measured parameter such as temperature, age, light level, humidity, altitude, and the like.

In the embodiment of FIG. 2, control system 200 is provided for a common-anode configuration of laser diode 105 and regulates laser diode optical power output ($P_O$). As above, a current source, such as transistor 160 provides current $I_{LD}$, which generates optical power output $P_O$ from laser diode 105. Control system 200 provides a voltage at control node 121 that sets current through laser diode 105, via device 160, here whose collector terminal is coupled to the cathode of laser diode 105. As will be appreciated by those skilled in the art, other current source configurations may be used, including, but not limited to the use of one or a plurality of bipolar transistors, one or a plurality of MOSFET transistors, or one or a plurality of amplifiers, to provide a current source function in response to $V_{BIAS}$. In the embodiments described herein, an increase in voltage at node 121 results in an increase in current through laser diode 105, although other circuit topologies could be used where the opposite is true. The embodiment depicted in FIG. 2 provides optical feedback, meaning that optical power output sensed by monitor photodiode 110 is used to generate current $I_{PD}$. Current $I_{PD}$ establishes a voltage at node 125, an inverting input to amplifier 120, thereby regulating the base or control node voltage of variable current source 160, and therefore regulating $I_{LD}$ and thus $P_O$.

In contrast to the embodiment of FIG. 1, control system 200 of FIG. 2 replaces reference voltage source 135 with a programmable voltage reference, provided by precision digital-to-analog converter (DAC) 170. Resistor 141 is a digitally programmable resistor whose role is similar to $R_1$ in FIG. 1. In preferred embodiments, the resistance value of resistor 141 may range from a few hundred ohms to a few hundred killiohms. The operational amplifier servo-control loop shown in FIG. 2 operates similarly to that described above, except advantageously $R_2$ 141 and/or $V_{DAC}$ can adjust the laser diode output power. For example, $R_2$ can be used for coarse adjustment and $V_{DAC}$ can be used for fine adjustment.

In operation, a variety of inputs including but not limited to, all or a portion of temperature, laser current, photodiode current, and optical power are provided to multiplexor 265. At least one multiplexor output signal is provided as input to analog-to-digital converter (ADC) 270, which translates the multiplexed analog parameter inputs to a digital output value. ADC 270 provides a digital output value as an input to preferably non-volatile memory 260, which stores configuration and calibration settings that determine the resistance value of variable resistor 141. Software control 275 and interface and control logic 280 may be used to set the values or manipulate the operation of any or all of non-volatile memory 260, ADC 270, and MUX 265. For example, control 275 and logic 280 may be used to load initial settings into non-volatile memory.

For fine adjustment such as temperature control compensation and the like non-volatile memory 260 advantageously further includes temperature-dependent codes to control digital-to-analog converter (DAC) 170. In some embodiments, temperature-dependent DAC codes may be related to the output of analog-to-digital converter 270, which measures temperature, laser current, photodiode current, optical power, or may relate substantially any other system or environmental parameter. Accordingly, fine adjustment to the voltage at node 130 may be dependent on one or more of the above-mentioned parameters.

DAC 170 converts a digital signal from non-volatile memory 260 to an analog signal that establishes a voltage at node 130, a non-inverting input node for amplifier 120. Preferably the temperature codes compensate for a change in output power for a sensed ambient temperature (or other system parameter). Codes may be provided as well for other system parameters affecting resistor 141, including without limitation age, humidity, altitude, light level, etc. That is, an adjustment to the voltage at node 130 based on a system parameter may be stored, for example, in a look-up table and then read to adjust voltage appropriately for ambient parameters.

As temperature changes, the performance of the various transmitter optical sub-assembly (TOSA) components may change, changing the relationship between the output power and the feedback signal. Thus, output power may change from its intended value even though the loop is operating correctly. Accordingly, the DAC output voltage or resistor 141 resistance can increase or decrease by a certain percentage per degree centigrade. The output voltage of DAC 170 could range from 0 to $V_{REF}$, where $V_{REF}$ is preferably in the range of 1-2.5V. For example, in one embodiment DAC 170 is an 8-bit DAC with an output range of 0 to 1.22 volts, and DAC output resolution would be 1.22/2' or approximately 4.8 mV per bit. The 8-bit DAC input codes may be provided from a look-up table (LUT) that outputs an 8-bit code based on temperature (or other parameter). The temperature dependent adjustment range is +/−50% in one embodiment as temperature varies from a nominal operating temperature to a maximum and minimum expected operating temperature. DAC 170 and/or resistor 141 can be programmed to change based on temperature (or other parameter). DAC 170 and resistor 141 typically provide 8 to 16 bits of resolution.

In a preferred embodiment, the parameter dependent codes represent numerical offsets preferably in 8-bit two's-complement binary that are applied to a nominal value, where the nominal value is preferably an 8-bit integer. The nominal DAC value and the resistor selection can be determined during initial calibration, and offsets taken from the look-up table may be positive or negative numbers. In a preferred embodiment, the offsets range from +127 to −128, although other ranges are possible. The nominal DAC setting is accordingly in the range of 0-255 in a preferred embodiment, and offsets influence the DAC setting by ± half-scale. These ranges are preferable for an 8-bit system, but other ranges may be used, as well as other ranges selected for use with a system employing a larger or fewer than 8 bits.

In one embodiment, the DAC's full-scale range is preferably 1.22V for optical feedback and 305 mV for current-feedback configurations, described further below. The monitor photodiode current or laser bias current will vary according to $V_{DAC}/R_2$. Temperature is taken as an input for compensation, but the input could be any variable that effects system operation, including without limitation a temperature, supply voltage, elapsed time to account for aging, and the like.

It will be readily appreciated by those skilled in the art that various elements and topologies may be utilized to set a voltage at node 130, in series or parallel with variable resistor 141. Generally, passive elements including capacitors, resistors, and inductors may be used to influence the voltage at node 130. Further, a variety of elements may be coupled between, for example, DAC 170 and node 130. The goal is that resistor 141 coarsely sets the voltage at an inverting input to operational amplifier 120. DAC 170 further provides a signal that adjusts, or refines, the voltage at a non-inverting input to operational amplifier 120, and therefore allows for further compensation in the event that the value of resistor 141 has shifted or variations in laser diode or photodiode parameters are encountered. Accordingly, both coarse and fine adjustments are provided by control system 200. Precision optical power output control compensation is provided by system 200 over a wide dynamic range and temperature, or other system or environmental parameter.

In a preferred embodiment, the programmable resistor is preferably selectable from 0.8 kΩ to 51.2 kΩ, and the full-scale feedback voltage range, which corresponds to the output range of the DAC, is 1.22V. In this embodiment, the range of monitor photodiode currents that can be accommodated is 0-1.525 mA to 0-24 µA. The DAC is used to adjust the monitor photodiode current setting from zero (DAC=0=0V) to full-scale (DAC=255=1.22V), where the full-scale value is determined by the resistor setting and can range from 1.22V/51.2 kΩ=24 µA to 1.22V/0.8 kΩ=1.525 mA.

FIG. 3 depicts another embodiment of a common-anode, optical feedback configuration of a power output control system, somewhat analogous to the embodiment shown in FIG. 2, with some optional components omitted for ease of illustration. Variable resistor 141 provides a voltage at an inverting input to amplifier 120, and DAC 170 provides finer control by altering the reference voltage, or voltage at non-inverting input node 130. MUX 265, ADC 270, non-volatile memory 260, interface and control logic 280, and software control 275 are not shown in FIG. 3 for ease of illustration and because the structure and configuration of these components may vary according to the embodiment and application contemplated, as will be readily appreciated by those skilled in the art in light of this specification.

The above described systems can further be extended for use with other laser diode configurations. FIG. 4 depicts an embodiment of a control system according to the present invention for use with a common-cathode laser diode configuration. In general, the operation of control system 400 is analogous to control system embodiments described above, with alterations in topology to accommodate a common-cathode configuration. Variable resistor 141 is provided to set a voltage at inverting input node 125 of operational amplifier 120. The voltage at node 125 is proportional to $P_O$ in that $P_O$ generates a current, $I_{PD}$ through monitor photodiode 110. Current $I_{PD}$ flows through variable resistor 141, setting voltage $V_{FB}$ at node 125. Digital-to-analog converter 170 sets voltage $V_{DAC}$ at node 130, a positive input terminal to feedback amplifier 120. In this manner, variable resistor 141 and DAC 130 control the voltage at the base of transistor 160.

As before, variable resistor 141 controls coarse adjustment to the control loop, for example, the value of variable resistor 141 may be chosen based on a required power output level and a given laser diode. DAC 170 controls fine adjustment to stabilize the control system during, for example, temperature or other system parameter variations. Control system 400 may include a multiplexor having a variety of system parameters as inputs, an analog-to-digital converter, memory or memories, preferably non-volatile memory, interface and control logic, as well as software control.

The above described embodiments of control systems for laser diode output power control utilize optical feedback. That is, a portion of the optical output of a laser diode is collected by a monitor photodiode to generate a current, $I_{PD}$, which is sampled and used for feedback to a transistor used to regulate the current through the laser diode.

By contrast, FIGS. 5 and 6 schematically depict two embodiments of the present invention that employ current feedback. That is, current through a laser diode is itself sampled and used as feedback to a device, such as a transistor, that is used to control that current.

FIG. 5 depicts a laser diode output power control system having a common-cathode, current-feedback configuration. Control system 500 includes variable resistor 141. In current-feedback configurations, preferable values for resistor 141 are generally lower than values used in the optical feedback configurations described above. Accordingly, either a lower-value programmable resistor is employed, or an external sense resistor is used. Operation is generally as follows. A servo-control loop is formed by PNP laser bias-driving transistor 160, laser diode 105, DAC 170, and laser diode bias current set resistor 141. Op amp 120 drives the base of transistor 160 to stabilize the voltage at its inverting input to $V_{DAC}$. Neglecting the input bias current in the op amp's inverting input terminal and the PNP base current, the laser diode current is given by $I_{LD}=V_{DAC}/R_2$. Once again, either $V_{DAC}$ or $R_2$ can be used to set and adjust $I_{LD}$.

FIG. 6 depicts an embodiment of a laser diode output power control system having a common-anode, current feedback configuration, in which control system 600 employs a bipolar NPN transistor 160 whose collector is coupled to the cathode of laser diode 105. The control loop formed is similar to operation of the embodiment shown in FIG. 5, and described above. Resistor 141 ($R_2$) sets the bias current through the laser diode, while DAC 170 provides compensation during operation.

The various above-described embodiments depict a variety of topologies for an operable circuit, preferably comprising a laser diode and current source, or transistor as well as a laser diode output control system (or portions thereof). However, in some applications it may be desirable to provide a single control system that can function with a common-cathode or common-anode coupled laser diode, as well as in a current feedback or an optical feedback configuration.

FIG. 7 depicts a laser diode output power control system 700 that can be coupled to a laser diode and a transistor, or other current source, for current regulation. Laser diode output power control system 700 can be configured, through the use of switches and DAC level shift and range adjust circuitry, to support common-anode and common-cathode laser diode configurations, and optical feedback and/or current feedback configurations can be accommodated. Control system 700 preferably provides both coarse and fine control of the power output of a laser diode through feedback amplifier 120. Amplifier 120 receives input voltages and outputs control voltage $V_{BIAS}$ that can be coupled as an input to a device to influence the output power of a laser diode.

Variable resistor 141 provides coarse control of control system 700, by setting the voltage, $V_{FB}$, at node 125 according to a current sampled from a laser diode or photodiode and coupled to node 125 during operation. Digital-to-analog converter (DAC) 170 provides finer control of an input to amplifier 120 in response to any of a variety of system parameters. (Without limitation such parameters may include temperature, laser diode current, photodiode current, optical power, and the like.) DAC 170 can provide fine adjustment during system operation to maintain stability and functionality even as parameters fluctuate during operation. In the embodiment of FIG. 7, the output of DAC 170 sets a voltage at node 130.

As shown in FIGS. 3-6, a common-anode configuration generally requires that variable resistor 141 have one terminal coupled directly or otherwise, to a reference node, e.g. ground. That is, variable resistor 141 is coupled between a ground node and node 125 for common-anode configurations. In embodiments using a common-cathode configuration, variable resistor 141 similarly is coupled (directly or otherwise) between node $V_{DD}$ and node 130. Accordingly, control system 700 comprises switch $S_1$ (725) and $S_2$ (730) to switch one node of variable resistor 141 to either a $V_{DD}$ node or a ground node. As will be readily appreciated, switches $S_1$ and $S_2$ may be programmable, and may comprise a variety of elements including transistors, resistors, or the like. Generally, switch 725 is in a closed position for a common-anode configuration of a laser diode, while switch 730 is open. For a common-cathode configuration, switch 730 is in a closed position, while switch 725 is open. It will be readily appreciated that the switch configuration and topology may be modified in a variety of ways while maintaining the ability to switch a terminal of variable resistor 141 between a node associated with ground and a node associated with $V_{DD}$.

Control system 700 further comprises switches 735-738 to support either a common-anode or common-cathode configuration of a laser diode, and current or optical feedback configurations. Implementing such switches is known in the art, and may be carried out using a variety of components, and thus further details are not given here. Switches 736 and 737 select a DAC output reference for DAC 170. For example, switch 737 would be closed, allowing $V_{DAC}$ to range from 0 to $V_{REF}$ in common-anode embodiments, such as those shown in FIGS. 3 and 6. In common-cathode embodiments, such as those shown in FIGS. 4 and 5, switch 736 would be closed allowing $V_{DAC}$ to range from $V_{DD}$ to ($V_{DD}$-$V_{REF}$). Further, embodiments employing current feedback configurations, such as those depicted in FIGS. 5 and 6, may require a smaller voltage signal range at an input node of a feedback amplifier. Accordingly, switches 735 and 738 are preferably provided to attenuate the voltage signal by a factor n. Generally, in preferred embodiments the factor n may range from 0.1 to 1, although other values may be used, for example in one preferred embodiment the DAC output signal is divided or attenuated by a factor of four for current-feedback configurations. In this embodiment, the full-scale DAC output range is 305 mV versus 1.22V for optical feedback. The goal of attenuating the DAC output range is to minimize the voltage drop across the sense resistor to allow operation at lower supply voltage, $V_{DD}$. Accordingly, DAC level shift and range adjust circuitry 745 along with switches 735-738 provide appropriate voltage levels as an input to feedback amplifier 120 to support various configurations of laser diodes and current sources, or transistors coupled to control system 700.

As described above, non-volatile memory 260 preferably stores configuration and calibration settings, compensation parameters, and serialization information such as serial numbers, date of manufacture, place of manufacture, product revision information, and/or the like.

The circuits thus far described generally relate to the low-frequency control of optical output power and laser diode bias current. By contrast, FIGS. 8 and 9 illustrate typical topologies for driving high frequency digital data into the laser diode for high-speed optical communications. In FIG. 8, voltage output driver 900 and AC coupling capacitor 910 drive high frequency digital data into the laser diode for high-speed optical communications. In FIG. 9, current output driver 920 is provided for DC coupling high frequency digital data into the laser diode. In both FIGS. 8 and 9, the laser diode current is modulated by the high-speed digital driver to produce optical pulses, which can then be transmitted through a fiber optic communications link. While FIGS. 8 and 9 depict coupling of high frequency data to the control system embodiment shown in FIG. 3, high speed digital data can similarly be coupled to the laser diode in any of the above-described control systems.

Accordingly, control systems are provided including digital variable resistors that provide coarse control of laser diode output power and digital-to-analog converters that provide finer control, or parameter compensation, of laser diode output power during operation. Generally, variable resistor 141 provides coarse adjustment, or calibration of the control system and a value for variable resistor 141 is chosen to compensate for unit-unit and lot-lot variations in the electro-optical components coupled to the control system, such as monitor photodiode 105 and laser diode 110. In preferred embodiments, variable resistor 141 can be changed over a 50:1 range in steps of 2:1, although such ranges can be made larger or smaller as needed in a particular application.

DAC 170 preferably has a resolution of 8-bits and can be adjusted over a 255:1 range, although DACs having greater or lesser resolution may also be used. As an example, assume the input of the control device (e.g., monitor photodiode current) is to be adjusted with 1% precision. In this example, an 8-bit DAC can span a further 2.55:1 variation in the initial conditions, while maintaining desired granularity (255/100=2.55). Variable resistor 141 is preferably adjustable over a 50:1 range (50:1~5.65 bits), resulting in a system that is adjustable over a total dynamic range of 50×255=12,750:1. Accordingly, this exemplary system can accommodate a 125:1 variation in initial conditions while maintaining 1% adjustability, the equivalent of 13.6 bits of resolution.

Advantageously, employing a DAC simultaneously with a variable resistor for control of laser diode output power can provide a large achievable adjustment range, e.g., 12,750:1. A variable resistor alone required to realize this range would be too large, too complex, and/or too expensive to be of practical use. A DAC alone capable of this range would be significantly more difficult to design, trim, and test. Accordingly, the described combination of variable resistor and DAC control achieves significant performance advantages.

Furthermore, a high-resolution DAC or resistor must frequently handle values of output voltage or resistance that are very high or very low, and physical constraints may limit the practical values that can be achieved. For example, output may vary by 1.22V with 8-bit resolution where each least significant bit (LSB) is 4.76 mV, which leaves adequate voltage drive (or "headroom") when operating with a 3.3V supply. A similar 13.6-bit DAC would require an LSB on the order of 100 μV, forcing the system to be extremely precise, more costly and more susceptible to noise. The combination of a moderately precise DAC with a moderately precise programmable resistor thus yields results superior to what is achievable with a more precise version of either one by itself.

Further, loop stability and noise immunity are enhanced by the above-described topology. Adequate feedback signal levels can be maintained, by varying the feedback resistance, variable resistor 141 (as opposed to providing a DAC alone with sufficient resolution). The system is thus not required to cope with very small voltages or high levels of precision. Further, variation in system loop gain is less. Changes in variable resistor 141 compensate for changes in the gain of the transmitter optical sub-assembly (TOSA), the combination of laser diode 110 and monitor photodiode 105. A TOSA whose monitor photodiode current is small, i.e. its gain is low, is offset by changing to a higher resistor value, adding gain to the loop and raising the magnitude of the resulting feedback signal.

The control systems described above provide compensation of a system variable such as resistance of a variable resistor in response to variations in a system parameter, such as temperature, by storing compensation constants, e.g. in a look-up table. Based on the value of the sampled system parameter, a system variable can be adjusted by combining the appropriate compensation constant with the present system variable value. The look-up table is digitized in that one compensation constant is stored for a given range of system parameter values. Generally the parameter ranges may vary according to application, however the width of the compensation ranges is preferably large relative to the quantization noise to minimize the effects of jitter due to quantization noise. For example, in a preferred embodiment one compensation constant is stored in a look-up table for each two-degree temperature range (for example, 0° C. to 2° C.) while the quantization noise is ±¼° C.

An input parameter, preferably temperature, is measured and the resultant measurement is used as an index to the look-up table. The (positive or negative) value retrieved from the table is added to a preset nominal value and the resulting sum is output via the DAC. Flexible mapping between the input parameter and output parameter is possible, subject to the particular numerical representations used. The temperature range spanned by the look-up table can be user-selectable and programmable offset can be added to the measured parameter before it is used to index the look-up table. Further, if the calculated table index is greater than the maximum table value, the maximum table value can be used. Similarly, if the calculated table index is less than the minimum table value, the minimum table value can be used.

System parameters samples can be taken at a resolution finer than the resolution of the look-up table intervals. In other embodiments, an average of a plurality of system parameter samples may be taken and the average used as the system parameter value to look-up a compensation constant. Preferably, the compensation constant, or compensation point, is updated only when the system parameter has moved beyond the center of another look-up table interval.

FIG. 10 schematically depicts an embodiment of the above-described compensation procedure, in which a system variable is compensated for variation in temperature. Temperature is sensed to an accuracy of one degree or better, and temperature compensation is implemented by adding or subtracting a compensation constant as needed to the output parameter. Compensation constants are stored in table 800, with a separate constant for every two-degree range of temperature. In FIG. 10, compensation constant are shown as $P_n$, where n is the center of a particular two-degree temperature range. For example, $P_1$ is the constant for the range 0° C. to 2° C., with axis 810 representing temperature.

A compensation point is generally referred to as the temperature at which the compensation constants are selected to provide the appropriate parameter offsets to the system. This temperature is referred to as $T_C$ and is represented by points 815, 816, 817, 818, 819, and 820. In FIG. 10, the temperature compensation points lie at the middle of each temperature range but in other embodiments, the temperature compensation points may be defined as any particular location within each parameter range, e.g. the low point, the high point, or any fraction there between. An initial $T_C$ is determined by finding the nearest compensation point to a first parameter sample. In the embodiment shown in FIG. 10, the initial $T_C$ is given by finding the nearest odd temperature to the present temperature; that is, if the temperature of the system is 22.5° C., an initial $T_C$ of 23° C. is set.

During operation, the system samples parameter values (such as temperature) at pre-set intervals. A new parameter value, e.g. temperature, $T_n$, is found or calculated, and the system determines whether to use this new temperature value to update $T_c$ (or other parameter). In one embodiment, $T_N$ is found by taking an average of a plurality of successive parameter samples, e.g. sixteen consecutive samples may be averaged to calculate $T_n$, thus providing a more accurate measurement of the system's current temperature (or other parameter). Further, averaging reduces the effects of quantization noise.

$T_N$ is then compared with $T_C$. If the magnitude of the difference between $T_N$ and $T_C$ is greater than the size of the range associated with each compensation constant (–2° C. in FIG. 10) then $T_C$ is updated with the closest compensation point to $T_n$, the closest odd temperature value in the embodiment of FIG. 10. Accordingly, the compensation point is constrained to be updated in fixed intervals (2° C. intervals as shown in FIG. 10), or multiples thereof. For example, if $T_C$ shifts by multiple 2° C. intervals between successive samples, $T_C$ is moved to the closest odd temperature to $T_n$, which may be four, six, or any multiple of two degrees away from $T_C$.

Accordingly, look-up tables for use with the above-described parameters may be stored in a memory coupled to a variable component in the above-described laser diode output power control systems. In a preferred embodiment, the temperature compensation algorithm is implemented by a custom, hard-wired logic state-machine. The algorithm can also be implemented with programmable logic, a microcontroller, and/or software/firmware residing off-chip, and the like. Further, it is to be understood that the above-described compensation procedure is not limited to use with laser diode control systems, nor limited to use for temperature compensation. Rather, compensation may be provided for substantially any system variable in response to substantially any chosen system parameter.

The foregoing descriptions of specific embodiments and best mode of the present invention have been presented for purposes of illustration and description. They are not intended to be exhaustive or to limit the invention to the precise forms disclosed, and obviously many modifications and variations are possible in light of the above teaching. For example, the above-described circuit topologies were coupled between a single $V_{DD}$ power supply and ground. As will be readily appreciated by those skilled in the art, embodiments of the present invention include circuit topologies coupled between ground a negative $V_{SS}$ power supply, between two power supplies, $V_{DD}$ and $V_{SS}$, etc. Further, components of the present invention may be fully integrated with one another, or may merely be in functional communication with one another. Some or all components described above may be integrated on one or more semiconductor chips, for example, and other components bonded or otherwise brought into communication with the chip or chips. Further, some or all components described above may be packaged and integrated with methods known in the art, for example on printed circuit boards and the like.

The embodiments were chosen and described to explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of compensating a system variable in response to a system parameter comprising:
   providing a look-up table with a plurality of system parameter offset ranges wherein for each of said plurality of system parameter offset ranges said look-up table associates a separate compensation constant with each of said plurality of system parameter offset ranges;
   sampling said system parameter;
   calculating a first compensation point associated with said system parameter, wherein said calculating a first compensation point provides a first compensation point;
   looking-up said compensation constant associated with said first compensation point; and
   adjusting said system variable using said compensation constant.

2. A method according to claim 1, wherein:
   said calculating a first compensation point comprises averaging a plurality of system parameter samples wherein said averaging a plurality of system parameter samples provides an average of a plurality of system parameter samples; and
   rounding said average of a plurality of system parameter samples to the nearest midpoint value of said ranges.

3. A method according to claim 2, wherein:
   said system variable comprises voltage; and
   said system parameter comprises temperature.

4. The method according to claim 2, wherein:
   the system variable comprises voltage; and
   the system parameter comprises resistance of a variable resistor.

5. A control system for a laser diode, comprising:
   a memory storing a look-up table containing a plurality of system parameter offset ranges, and a plurality of compensation constants, each of said plurality of compensation constants associated with one of said plurality of system parameter offset ranges;
   a sensor operative to sample the system parameter;
   control logic operative to receive the system parameter from the sensor and further operative calculate to a first compensation point associated with said system parameter; wherein
      the control logic is further operative to classify the compensation point as falling within a one offset range of the plurality of system parameter offset ranges in the look-up table;
      the control logic is further operative to retrieve a particular compensation constant corresponding to the one offset range; and
   at least one adjusting element operative to adjust a system variable using the compensation constant, the at least one adjusting element operationally connected to the control logic.

6. The control system of claim 5, wherein the at least one adjusting element is a digital-to-analog converter.

7. The control system of claim 6, further comprising a second adjusting element operative to further adjust the system variable and operationally connected to the control logic.

8. The control system of claim 7, wherein the second adjusting element is a programmable resistor.

9. The control system of claim 7, wherein the at least one adjusting element and the second adjusting element may operate simultaneously to adjust the system variable.

10. The control system of claim 6, wherein the digital-to-analog converter may operate in a first configuration to adjust the system variable and a second configuration to adjust the system variable.

11. The control system of claim 10, wherein:
the first configuration is an optical feedback configuration; and
the second configuration is a current feedback configuration.

12. The control system of claim 5, wherein the system parameter is chosen from the group comprising: a laser diode current; a photodiode current; and optical power.

* * * * *